(12) United States Patent
Loh et al.

(10) Patent No.: US 9,406,403 B2
(45) Date of Patent: Aug. 2, 2016

(54) SPARE MEMORY EXTERNAL TO PROTECTED MEMORY

(71) Applicant: Advanced Micro Devices, Inc., Sunnyvale, CA (US)

(72) Inventors: Gabriel H. Loh, Bellevue, WA (US); Vilas Sridharan, Brookline, MA (US); James M. O'Connor, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 123 days.

(21) Appl. No.: 13/926,155

(22) Filed: Jun. 25, 2013

(65) Prior Publication Data
US 2014/0376320 A1    Dec. 25, 2014

(51) Int. Cl.
*G11C 29/00*    (2006.01)
*G11C 11/401*   (2006.01)

(52) U.S. Cl.
CPC .............. *G11C 29/76* (2013.01); *G11C 11/401* (2013.01)

(58) Field of Classification Search
CPC   G11C 16/3459; G11C 11/5628; G06F 12/02; G06F 12/0246
USPC .............. 711/E12.001, E12.002; 365/185.09, 365/200; 714/8, 773, 768
See application file for complete search history.

(56) References Cited

U.S. PATENT DOCUMENTS

| | | | | |
|---|---|---|---|---|
| 5,347,484 A | * | 9/1994 | Kwong et al. | 365/49.16 |
| 5,502,333 A | * | 3/1996 | Bertin et al. | 257/685 |
| 6,996,017 B2 | * | 2/2006 | Scheuerlein | G11C 7/1006 365/200 |
| 7,035,142 B2 | * | 4/2006 | Khouri et al. | 365/185.09 |
| 2005/0044459 A1 | * | 2/2005 | Scheuerlein | G11C 7/1006 714/719 |
| 2005/0081093 A1 | * | 4/2005 | Joly et al. | 714/8 |
| 2012/0124532 A1 | * | 5/2012 | Coteus et al. | 716/104 |
| 2013/0007544 A1 | * | 1/2013 | Nemazie et al. | 714/723 |
| 2013/0318418 A1 | * | 11/2013 | Bedeschi | G06F 11/1048 714/758 |
| 2014/0097869 A1 | * | 4/2014 | Ngai | 326/41 |

OTHER PUBLICATIONS

Mincent Lee, "A Memory Built-In Self-Repair Scheme Based on Configurable Spares", IEEE Transactions on Computer-Aided Design of Integrated Circuits and Systems, vol. 30, No. 6, Jun. 2011, 11 pages.

* cited by examiner

*Primary Examiner* — Vanthu Nguyen
*Assistant Examiner* — Jerome Leboeuf

(57) ABSTRACT

A memory subsystem employs spare memory cells external to one or more memory devices. In some embodiments, a processing system uses the spare memory cells to replace individual selected cells at the protected memory, whereby the selected cells are replaced on a cell-by-cell basis, rather than exclusively on a row-by-row, column-by-column, or block-by-block basis. This allows faulty memory cells to be replaced efficiently, thereby improving memory reliability and manufacturing yields, without requiring large blocks of spare memory cells.

18 Claims, 7 Drawing Sheets

MAPPING TABLE
300

SPARE CELL ARRAY
330

SPARE MEMORY EXTERNAL TO PROTECTED MEMORY

BACKGROUND

1. Field of the Disclosure

The present disclosure generally relates to processing systems and, more particularly, to memory systems for processing systems.

2. Description of the Related Art

The memory found in processing systems often includes features such as error correcting codes (ECC) to improve data storage reliability. These reliability features provide for the detection and correction of transient errors when data is retrieved from the memory. Some memories may also include features to address more permanent errors resulting from manufacturing defects. For example, some memory devices include a conventional row redundancy mechanism whereby spare rows of memory cells are incorporated directly into the array. The spare cells and associated logic are used to logically "replace" a defective row (i.e., a row of memory cells having one or more defective memory cells). Typically, spare rows are enabled by selectively blowing fuses within a spare row decoder to match the address of the rows having defective memory cells. These fuses are often programmed during manufacture at testing stage of the wafer, die or completed and packaged memory device.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF PREFERRED EMBODIMENTS

FIGS. 1-7 illustrate example techniques for improving reliability and manufacturing yield of processing systems and other electronic assemblies through the use of a memory subsystem employing spare memory cells external to one or more memory devices (referred to herein as the "protected memory"). In some embodiments, a processing system uses the spare memory cells to replace individual selected cells at the protected memory, whereby the selected cells are replaced on a cell-by-cell basis, rather than exclusively on a row-by-row, column-by-column, or block-by-block basis. This allows faulty memory cells to be replaced efficiently, thereby improving memory reliability and manufacturing yields, without requiring large blocks of spare memory cells.

In some embodiments, the processing system includes an electronic assembly that may include vertically-stacked die and further may include horizontally-stacked die disposed at an interposer. The electronic assembly may include a memory subsystem having memory devices, processing devices and processing support logic and the like. The memory subsystem may include multiple vertically-stacked die containing storage cells employing memory architectures such as DRAM and the like.

Figure 1:
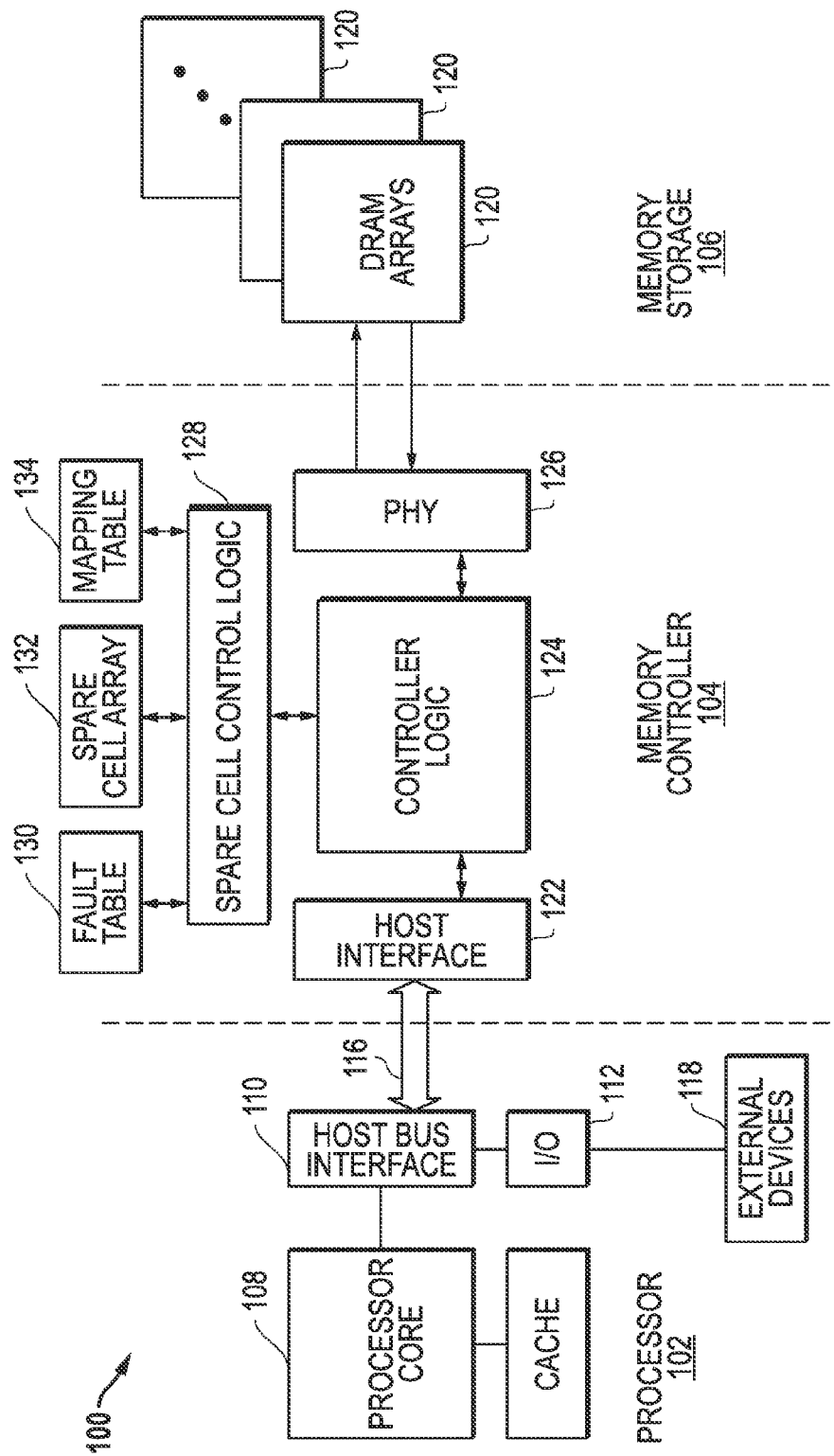
FIG. 1 is a diagram illustrating an example processing system including a memory subsystem employing a spare cell array external to protected memory in accordance with some embodiments.

FIG. 1 illustrates an example processing system 100 implementing a memory subsystem employing a spare cell array external to the protected memory according to some embodiments. The processing system 100 can comprise any of a variety of computing systems, including a notebook or tablet computer, a desktop computer, a server, a network router, switch, or hub, a computing-enabled cellular phone, a personal digital assistant, and the like. In the depicted example, the processing system 100 includes a processor 102, a memory controller 104 and memory storage 106. The processor 102 is generally configured to execute sets of instructions to perform tasks defined by the instruction sets. The memory storage 106 is configured to store data for the processor 102. In the course of executing sets of instructions the processor 102 generates access requests to store data at (in the case of write requests) and retrieve data from (in the case of read requests) the memory storage 106. The memory controller 104 is configured to provide an interface between the process 102 and the memory storage 106. In particular, the memory controller 104 can perform operations such as issuing DRAM command sequences, buffering, timing control, and the like, based on memory access requests generated by the processor 102 in order to facilitate the transfer of data between the processor 102 and the memory storage 106. The memory controller 104 also provides memory protection operations for the memory storage 106 and in particular can detect and replace faulty memory locations of the memory storage 106 as described further herein.

The processor 102 includes one or more processor cores 108 such as central processing units (CPU) graphics processing units (GPU), digital signal processors (DSP), and the like. The processor 102 further includes an integrated host bus interface 110, an input/output (I/O) controller 112, one or more levels of cache 114, and the like. The host bus interface 110 is connected to the memory controller 104 via host bus 116. The I/O controller 112 can be connected to one or more external devices 118, such as one or more external interfaces to display components, storage devices, input devices (e.g., a mouse or keyboard), and the like. The host bus 116 couples the processor 102 to the memory controller 104. The host bus 116 can be implemented in accordance with any of a variety of conventional interconnect or bus architectures, such as a Peripheral Component Interconnect-Express (PCI-E) architecture, a HyperTransport architecture, a QuickPath Interconnect (QPI) architecture, and the like. Alternatively, the host bus 116 can be implemented in accordance with a proprietary bus architecture.

The memory storage 106 is comprised of one or more memory arrays 120. The memory arrays 120 may implement any variety of storage devices including, but not limited to, other memory architectures such as dynamic random access memory (DRAM), static random access memory (SRAM), ferroelectric RAM (F-RAM), magneto-resistive RAM (MRAM), memristors, phase change memory, NOR flash, NAND flash and the like. For the purposes of describing FIG. 1, the memory storage 106 is assumed to be a set of DRAM arrays and DRAM memory controllers. While the various embodiments are described in the context of providing spare cells for main memory arrays, the other embodiments include memory organizations such as but not limited to scratchpad memories, DRAM caches and the like. As described in detail below with reference to FIG. 6, the memory controller 104 and memory storage 106 may be implemented as stacked-die memory and thus the DRAM arrays 120 may be implemented as, for example, separate memory die within the stacked-die memory.

The memory controller 104 is configured to provide an interface between the processor 102 and the memory storage 106. In the depicted example, the memory controller 104 includes a host interface 122, controller logic 124, a physical interface (PHY) 126, spare cell control logic 128, a fault table 130, a spare cell array 132, and a mapping table 134. The host interface 122 couples the memory controller logic 124 to the host bus 116. The physical interface (PHY) 126 couples the memory controller 104 to the DRAM arrays 120.

The controller logic 124 is configured to issue DRAM commands based on memory requests generated by the processor 102 and to provide DRAM control, timing and management operations and the like. In addition, the controller logic 124 is configured to perform error detection and, depending on a size of a detected error, error correction for read requests directed to the memory storage 106. For example, in some embodiments, in response to a write request to write data to a particular location of the memory storage 106, the controller logic calculates an error correction code (ECC) value based on the data to be written, and stores the ECC value with the data at the location of the memory storage 106. In response to a read request, the controller logic 124 retrieves data, and the corresponding ECC value, from the location of the memory storage 106. The controller logic 124 performs error detection using the data and the ECC value according to conventional error detection techniques and can also perform error correction to correct the error if the error is of sufficiently small size. In response to detecting an error, the controller logic 124 identifies the bit cell of the memory storage 106 that stored the erroneous data. Over time, based on the bit cells identified during error detection, the controller logic 124 can identify one or more bit cells of the memory storage 106 as "faulty" bit cells, as described further herein. For example, the controller logic 124 can identify a particular bit cell of the memory storage 106 as faulty in response to detecting greater than a threshold number of errors at the bit cell.

The memory controller 104 includes additional resources configured to provide spare memory cells for the DRAM arrays 120. The additional resources include the spare cell control logic 128, the fault table 130, the spare cell array 132, and the mapping table 134. The spare cell array 132 contains spare memory cells that can be configured to replace faulty memory resources in the DRAM arrays 120. The fault table 130 stores information about DRAM errors such as the error location, error type, and the error count. The mapping table 134 stores the location of the replacement cells. The spare cell control logic 128 tracks and classifies DRAM errors using the fault table 130, and uses the mapping 130 to configure the replacement of faulty DRAM resources with spare cells from the spare cell array 132 as described in greater detail blow. In the example processing system 100, the spare cell array 132, the mapping table 134, the spare cell control logic 128 and the fault table 130 are implemented in the memory controller 104. In other embodiments, these resources may be implemented elsewhere in the system. Although the mapping table 134 and the fault table 130 are implemented as separate tables in the example, other embodiments may combine them into a single table used to both track DRAM errors and to identify replacement cells. As described further herein, the spare cell control logic 128, the fault table 130, the spare cell array 132, and the mapping table 134 are employed to replace memory cells at the memory storage 106 that have been identified as faulty on a cell-by-cell basis.

In operation, the memory controller 104 services memory read and memory write requests issued by the processing elements of the processing system 100. In response to memory access requests, the controller logic 124 issues commands to the DRAM arrays 120 via the physical interface 126. In response to a read request for a corresponding address, the controller logic 124 transmits signaling to the DRAM arrays 120 to read stored data at the addressed location. In response to a write request, the controller logic 124 transmits signaling to the DRAM arrays 120 to write data to the addressed location.

The controller logic 124 may implement conventional data reliability features such as ECC, or RAID-M and the like. In order to improve overall reliability, the processing system 100 also employs spare memory resources, which can detect and replace faulty memory locations in DRAM arrays 120. To illustrate, upon detection of an error, the spare cell control logic 128 creates or updates entries in the mapping table 134 and fault table 130 with information regarding the error as described in greater detail below with reference to FIGS. 4 and 5. This information may include, but is not limited to, the location (DRAM bank, row and column address) of the bit cell that resulted in the error, a tag indicative of the error location, an error count for that location and the type of the faulty DRAM resource such as a single-cell, an entire row or an entire column. The information also includes an index field that may point to one or more replacement cells in the spare cell array 132. Each entry in the mapping table 134 corresponds to a faulty DRAM resource. The mapping table is used by the spare cell control logic 128 to determine which, if any, spare cell replacements have been deployed for a faulty DRAM resource.

Based on memory access requests generated by the processor 102, the controller logic 124 issues DRAM commands to access a location in the DRAM array 120. In parallel with the DRAM access, the spare cell control logic 128 accesses an entry of the mapping table 134 for that location. The spare cell control logic 128 transmits signaling indicative of the bank, row and column address of the DRAM cells being accessed to the mapping table 134 and checks for a tag match. A tag match indicates that one or more replacement memory cells have been deployed for the memory location being accessed by the memory access request.

Read accesses to faulty DRAM locations are handled as follows: for a single faulty cell, the DRAM location (bank, row and column) will match on the tag, and the type field in the matching entry in mapping table 134 will indicate 'single cell' and the index field of the matching entry will point to a replacement cell in the spare cell array 132. The indicated spare cell is read from the spare cell array 132, and its value is used to replace the faulty bit read from the DRAM array 120. If the type field indicates a faulty column, then an entire column is read from the spare cell array 132 and the original row address is used to select the appropriate cell, whose value is used to replace the faulty bit read from the DRAM array 120. If the type field indicates a faulty row, then a row is read from the spare cell array 132 and original column address is used to select the appropriate cell whose value than replaces the faulty bit read from the DRAM array 120.

Write accesses to faulty DRAM locations are handled in a similar manner. The tag field will match, which indicates sparing is enabled for the matched location and the index field points to one or more replacement cells in the spare cell array 132. If the type field indicates a 'single cell' then a single spare cell is written with value of the data bit that was to be stored to the faulty DRAM cell. If the type field in the mapping table entry indicates a faulty column, then an entire column is read from the spare cell array and the original row address is used to select the appropriate cell which is written with the value of the bit from the original write data. If the type field indicates a faulty row, then a row is read from the spare cell array and original column address is used to select the appropriate cell to be written. Thus the replacement cells in the spare cell array 132 will contain a copy of the bit value that would have otherwise been lost when written to the faulty bit in the DRAM array 120. On subsequent read accesses to the faulty memory location, the values stored in the replacement cells are used to replace the faulty bit from the DRAM array 120, as described above.

Figure 2:
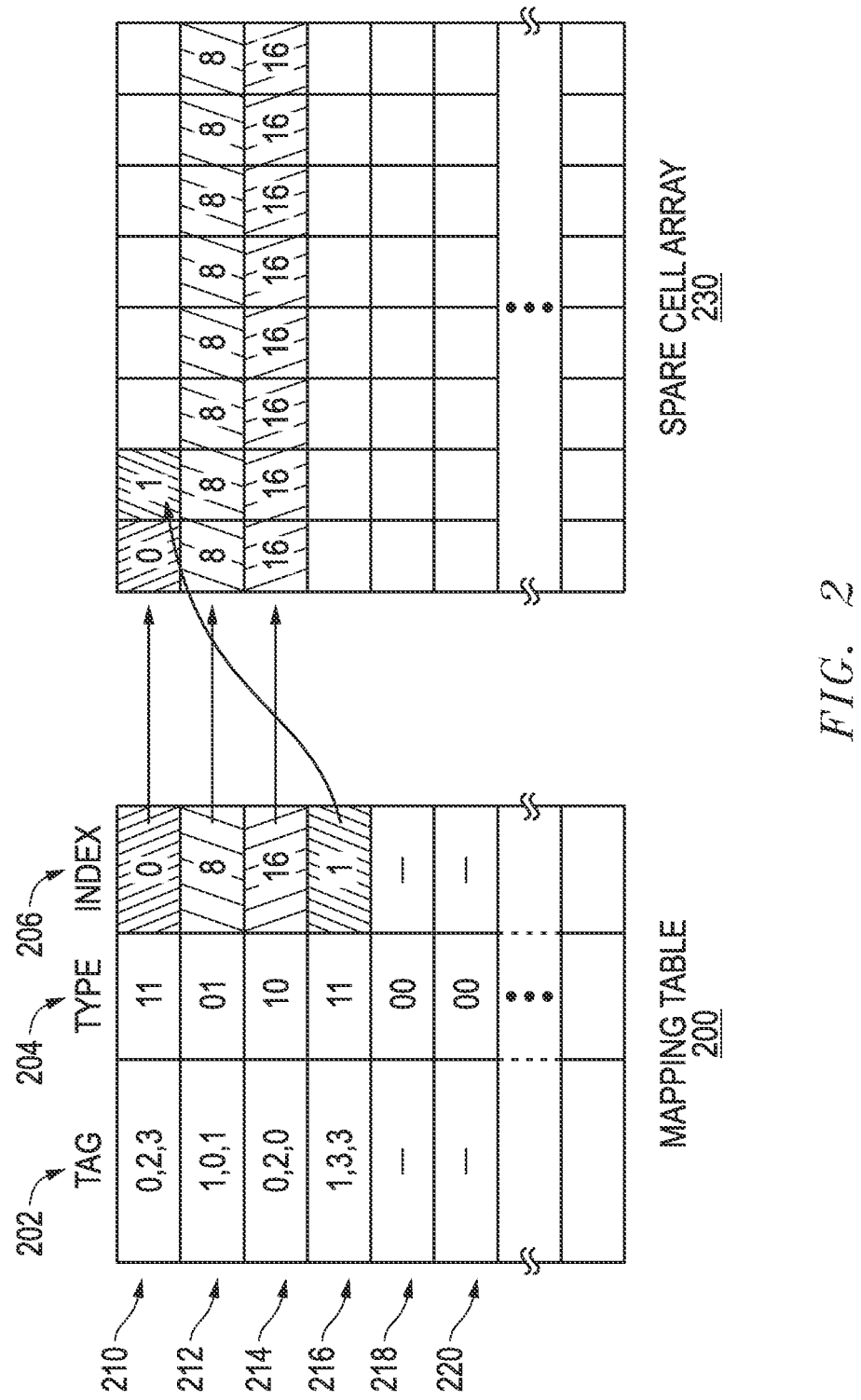
FIG. 2 is a diagram illustrating the organization of the mapping table and the spare cell array of FIG. 1 in accordance with some embodiments.

FIG. 2 illustrates an example mapping table 200 and an example spare cell array 230 according to some embodiments. The mapping table 200 is used by the spare cell control logic 128 (FIG. 1) to identify accesses to DRAM locations that have been previously identified as faulty, and to locate the corresponding replacement cells in the spare cell array 230. The spare cell array 230 provides spare memory cells for use as replacements for faulty DRAM locations.

Each entry in the mapping table 200 contains a plurality of fields including a tag field 202, an error type field 204, and an index field 206. For ease of illustration, the example mapping table 200 contains six entries 216-220. The tag field 202 contains an indication of address of a faulty location in the protected memory. In some embodiments, the tag may include the bank, row and column address of the faulty location in DRAM. The type field 204 contains a plurality of bits that encode the type of error. In the example mapping table 200, two bits are used and indicate whether the entry is for a faulty row (type=01), a faulty column (type=10), a single faulty cell (type=11) or not in use (type=00). The index field 206 contains a pointer into the spare cell array 230 and locates the spare cell (or multiple spare cells in the case of row or column replacement) used to replace the faulty locations in the protected memory.

The spare cell array 230 provides spare memory resources to use as replacements for faulty locations in the protected memory. In the example of FIG. 2, the spare cell array 230 contains a total of 64 spare bit cells arranged in an eight by eight array. In one embodiment, spare cell array 230 may be implemented as storage array in the memory controller. Alternatively, the spare cell array 230 may be implemented on a separate die in the same multi-chip module (MCM) package as the memory controller, on a separate die in vertically or horizontally stacked die system or in a separate chip outside of the package. The spare cell array 230 may implemented in high speed Static Random Access Memory (SRAM) or alternatively in any variety of storage technologies including, but not limited to, register arrays, flip flops, ferroelectric RAM (F-RAM) magneto resistive RAM (MRAM), DRAM and the like.

In operation, the mapping table 200 is accessed with the bank, row and column address in parallel with read or write to the original access to the DRAM array. In the example of FIG. 2, the mapping table 200 is implemented as a content addressable memory (CAM), which performs a fully associative lookup of all tags in the table. Other embodiments may use such as direct-mapped or set-associative lookup schemes and the like.

In the depicted example, the tag field for mapping table entry 210 contains {0, 2, 3} indicating location {bank 0, row 2, column 3} in the protected memory is faulty. The type field contains '11' indicating a single faulty cell and the index field points to location 0 in the spare cell array 330 as the replacement cell. Also in this example the tag field for mapping table entry 212 contains {1, 0, 1} indicating location {bank 1, row 0, column 1} in the protected memory is faulty. The type field contains '01' indicating a faulty row and the index field points to eight spare cells starting at location 8 in the spare cell array 230 as the replacement cells. As a further example, table entry 214 contains {0, 2, 0} indicating location {bank 0, row 2, column 0} in the protected memory is faulty. The type field contains '10' indicating a faulty column and the index field points to eight spare cells starting at location 16 in the spare cell array 230 as the replacement cells. Finally, entry 216 contains {1, 3, 3} indicating location {bank 1, row 3, column 3} in the protected memory is faulty. The type field contains '11' indicating another single faulty cell and the index field points to location 11 in the spare cell array 230 as the replacement cell.

During operation, the mapping table 200 is accessed with the bank, row and column address in parallel with read or write to the original memory location in DRAM array 120. If the lookup results in a tag match and the table entry is valid, then the corresponding data from the spare cell array 230 is read (or written, for write accesses). For example, if a read access to DRAM address {bank 0, row 0, column 3) is requested, a tag match will occur for mapping table entry 210. The type field for entry 210 indicates indicate 'single cell' (type=11) and the index field points to location 0 in the spare cell array as replacement cell in the. Location 0 is read from the spare cell array 230, and its value is used to replace the faulty bit read from the DRAM array.

The spare cell control logic 128 (FIG. 1) manages the allocation of replacement cells in the spare cell array 230. In the above example, single replacement cells for one-time failures are simply allocated by finding the next available cell in the spare cell array 230. Replacement cells for faulty rows or columns are allocated by using the next available full row in the spare cell array 230. In some embodiments, spare cells may be allocated (or de-allocated) in such a manner as to improve the utilization of spare cell resources.

Figure 3:
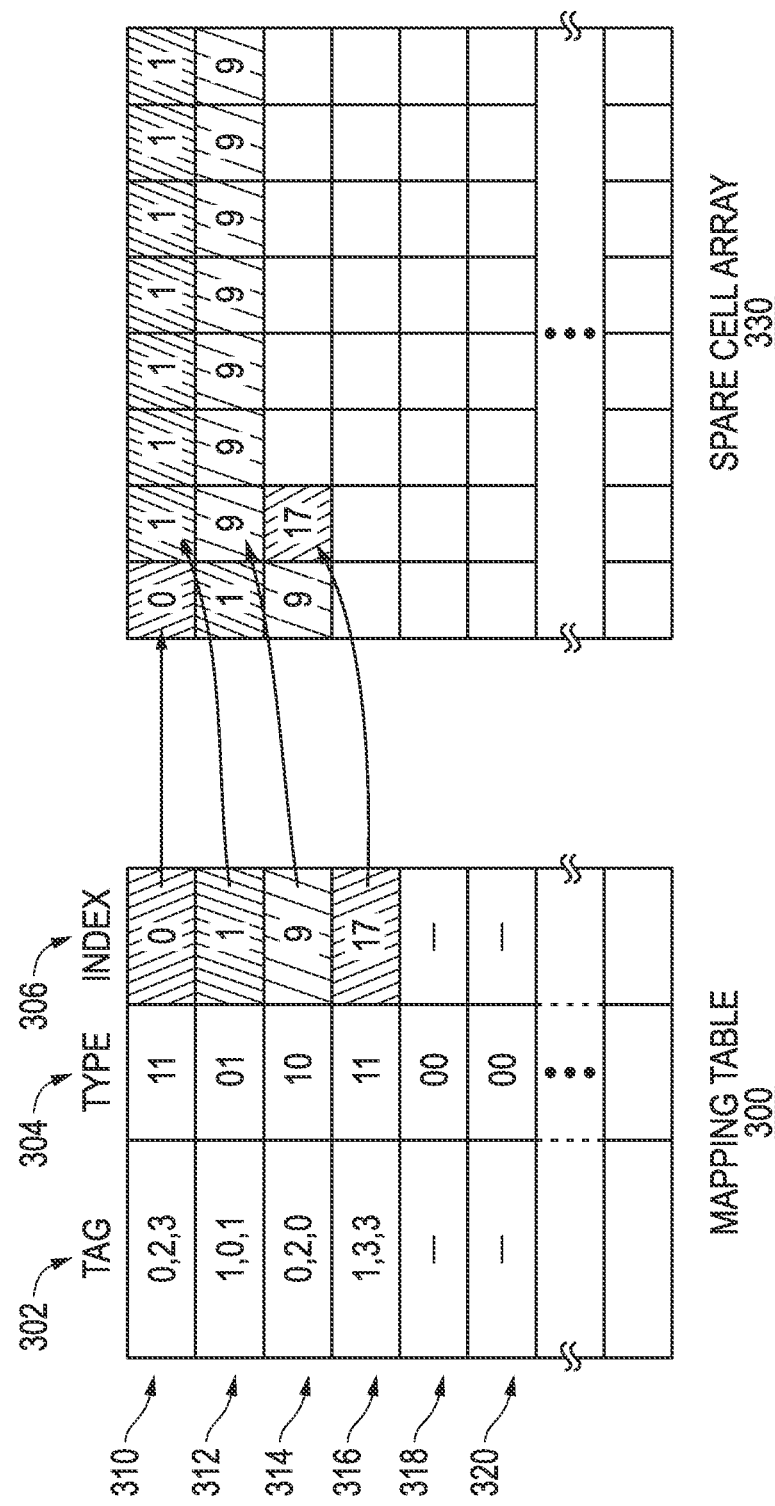
FIG. 3 is a diagram illustrating an alternate organization of the mapping table and the spare cell array of FIG. 1 in accordance with some embodiments.

FIG. 3 is a diagram illustrating an alternate organization of the mapping table 300 and the spare cell array 330, and in particular shows an alternate method for managing the allocation of spare cells in accordance with some embodiments. The alternate organization improves the utilization of spare cells by allocating cells in the spare cell array 330 in a sequential fashion rather than an aligned fashion as described earlier with reference to FIG. 2. Replacements for entire faulty rows or columns are allocated starting with the first unallocated cell in the spare cell array 330 resulting in more efficient utilization of the spare cell array.

Each entry in the mapping table 300 contains a plurality of fields including a tag field 302, an error type field 304, and an index field 306. For ease of illustration, the example mapping table 300 contains six entries 316-320. The tag field 302 contains an indication of address of a faulty location in the protected memory. In some embodiments, the tag may include the bank, row and column address of the faulty location in DRAM. The type field 304 contains a plurality of bits that encode the type of error. In the example mapping table 300, two bits are used and indicate whether the entry is for a faulty row (type=01), a faulty column (type=10), a single faulty cell (type=11) or not in use (type=00). The index field 306 contains a pointer into the spare cell array 330 and locates the spare cell (or multiple spare cells in the case of row or column replacement) used to replace the faulty locations in the protected memory.

The first entry 310 in the mapping table 300 is used to re-map a single faulty cell. The tag field for mapping table entry 310 contains {0, 2, 3} indicating location {bank 0, row 2, column 3} in the protected memory is faulty. The type field contains '11' indicate a single faulty cell and the index field points to location 0 in the spare cell array 330 as the replacement cell. The second entry 312 in mapping table 300 is used to remap a faulty row. The tag field for mapping table entry 312 contains {1, 0, 1} indicating location {bank 1, row 0, column 1} in the protected memory is faulty and the type field contains '01' indicating a faulty row. Unlike the aligned row allocation discussed previously in FIG. 2, the index field of entry 312 points to the next sequentially available locations which in this example are the eight cells starting at location 1 in the spare cell array 330. Similarly, the third entry 314 in mapping table 300 is used to remap a faulty column. As with entry 312, the spare row is allocated in a non-aligned fashion. The tag field for table entry 314 contains {0, 2, 0} indicating location {bank 0, row 2, column 0} in the protected memory is faulty and the type field contains '10' indicating a faulty column. The index field points to eight spare cells starting at location 17 in the spare cell array 330 as the replacement cells. Finally, the fourth entry 316 illustrates the replacement for a single fault cell being done in a sequential, unaligned fashion. Entry 316 contains {1, 3, 3} indicating location {bank 1, row 3, column 3} in the protected memory is faulty and type field contains '11' indicating a single faulty cell. The index field points to location 17, the next sequentially available cell in the spare cell array. By allocating and spare cells in a sequential unaligned manner, the utilization of the spare cell array 330 is improved.

In some embodiments, spare cells may be allocated, combined or de-allocated in such a manner as to improve the utilization of spare cell resources. For example, if multiple faulty single cells from the same row in the protected memory have been replaced, it may be advantageous to replace the entire row, thus combining the multiple mapping table entries into a single entry.

In some embodiments, in addition to reading and writing the spare resources, the memory request may continue to access the original memory location in order to check if the memory is still faulty. If the original memory location is consistently free from errors, the system may deduce that the fault has been resolved and the corresponding mapping table entries and spare cells can be de-allocated. For example, this may occur if an intermittent fault was due to elevated temperatures in the memory array that have since cooled or the faulty memory resources have been physically replaced.

Figure 4:
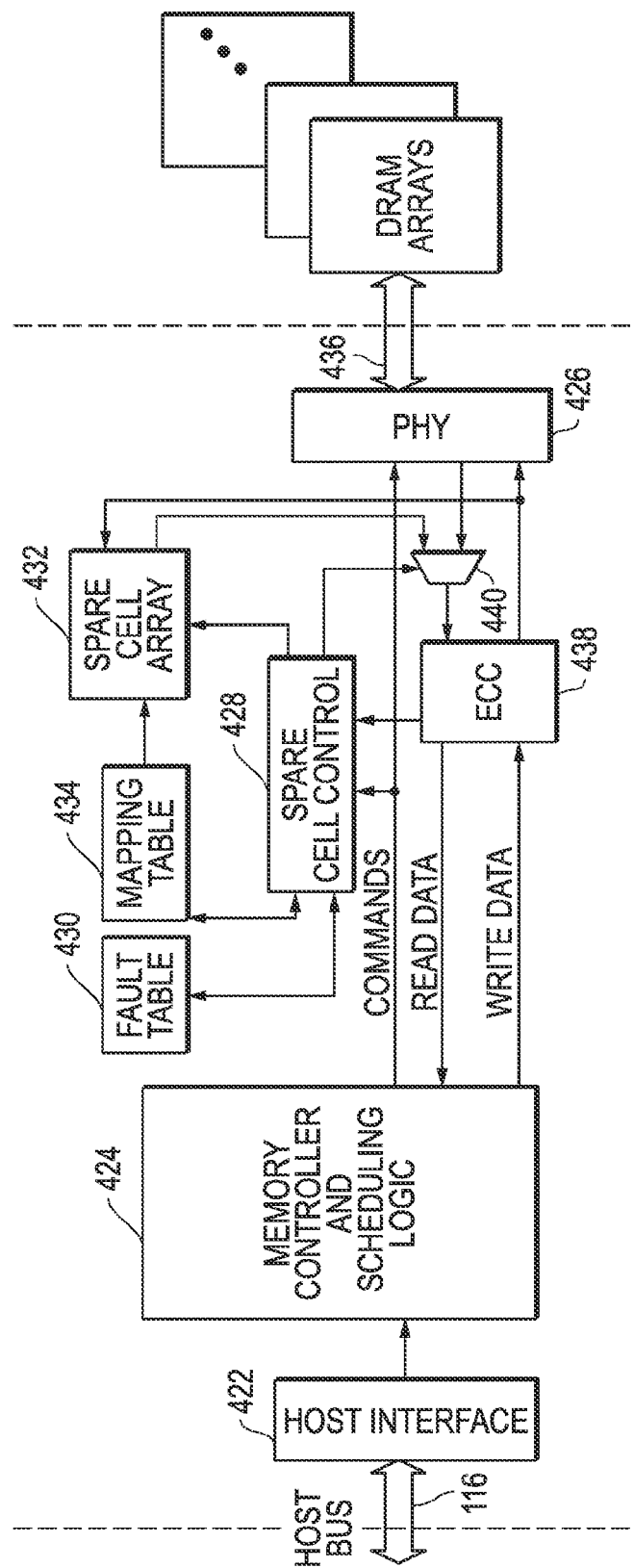
FIG. 4 is a block diagram of an example memory controller employing spare memory cells external to the protected memory of FIG. 1 in accordance with some embodiments.

FIG. 4. Is a diagram illustrating organization of an example DRAM memory controller 104 (FIG. 1) employing spare memory cells external to the protected memory in accordance with some embodiments. In the depicted example, the memory controller 400 includes a host interface 422, controller logic 424, a physical interface 426, spare cell control logic 428, a fault table 430, a spare cell array 432, and a mapping table 434 (corresponding to the host interface 122, the controller logic 124, the physical interface 126, the spare cell control logic 128, the fault table 130, the spare cell array 132, and the mapping table 134 of FIG. 1). A host bus 416 couples the host interface 422, to the processor 102 (FIG. 1), whereby the host interface 422 receives and buffers signaling representative of memory access requests transmitted over the host bus 416 to the memory controller 400. The host interface also transmits memory access request responses to the processor 102 via the host bus 416. In response to memory access requests, the controller logic 424 issues commands to the DRAM arrays 420 via the physical interface 426. In response to a read request for a corresponding address, the controller logic 424 transmits signaling to the DRAM arrays 420 to read stored data at the addressed location. In response to a write request, the controller logic 424 transmits signaling to the DRAM arrays 420 to write data to the addressed location. The controller logic 428 issues memory commands by manipulating the physical interface (PHY) 426. The PHY 426 is coupled to the conductors that comprise bus 436 to transmit signaling representative of the memory requests to the DRAM arrays 420. Responses from the DRAM arrays 420 are received by the PHY 426 and transmitted back to the controller logic 424.

The memory controller 400 includes the ECC logic 438 which is configured to correct errors that occur during operation of the memory. The ECC logic 438 generates a plurality of redundant bits (the "code") which are stored in the DRAM arrays 420 along with the original data. When the data is retrieved from storage, the code is simultaneously retrieved and then used to correct any errors in the data. Typical ECC mechanisms can detect and correct all single bit errors and can detect (but not correct) double bit errors. The ECC may also be expanded to implement RAID-M codes which can correct multiple-bit errors that result from an inoperative memory device. In addition to the conventional ECC logic 438, the memory controller 400 implements spare memory resources external to the DRAM arrays in accordance with some embodiments. The spare memory resources consist of the spare cell control logic 428, the fault table 430, the spare cell array 432, and the mapping table 434. These spare memory resources are used to provide replacements for faulty memory locations in the DRAM arrays 420. The mapping table 434 stores information corresponding to faulty memory resources that have been previously detected in the DRAM arrays 420. As previously discussed in reference to FIG. 2, a mapping table entry contain fields for the location (bank, row, column) of the failure, the type of fault, an error count and a pointer to replacement cells in the spare cell array 432.

Mapping table entries are created or updated in response to ECC errors. The ECC logic 438 transmits signaling indicative of ECC errors to the spare cell control logic 428. In the example shown, the ECC logic 438 is coupled directly to the spare cell control logic 428, in other embodiments it may be coupled indirectly, for example via the controller logic 424. Upon detection of an ECC error, the spare cell control logic 428 creates or updates entries in the fault table 430 and mapping table 434 with information about the error, as described in detail below with reference to FIG. 5. This information may include, but is not limited to the location of the ECC error, an error count for that location and the type of the faulty resource such as a single-cell, an entire row or an entire column. The information also includes an index field that may point to one or more replacement cells in the spare cell array 432. Each entry in the mapping table 434 corresponds to a faulty memory resource. On subsequent DRAM accesses, the spare cell control logic 428 uses information stored the mapping table 434 to determine which, if any, spare cell replacements have been deployed for a given memory resource.

In the course of normal operations, the controller logic 424 issues memory read and write requests commands to the DRAM arrays 420. In parallel with the DRAM operation, the spare cell control logic 428 applies the bank, row and column address to the mapping table 434. The mapping table 434 is implemented as a CAM, which performs a fully associative lookup of all tags in the table, other embodiments may use direct-mapped or set-associative lookups and the like. If a hit (a tag match) is detected, the corresponding mapping table entry is read out. The type field 204 (FIG. 2) of the matching entry contains a plurality of bits that encode the type of faulty resource which can include, but are not limited to, a single faulty cell, a faulty row, or a faulty column. The index field 206 of the matching entry contains a pointer into the spare cell array 432 and locates the spare cell (or multiple spare cells in the case of row or column replacement) used to replace the faulty DRAM locations.

For DRAM read accesses, a tag match in mapping table 434 indicates a memory access request to a location that contains a faulty memory resource. The contents of the matching table entry are used to control selection logic 440. In the case of a single faulty cell, the type field will indicate "single cell" and the index field points to or contains the address of the replacement cell in the spare cell array 432. This address is applied to the spare cell array 432 and the indicated spare cell location is read. The spare cell control logic 428 then directs the selection logic 440 to replace the faulty bit read from the DRAM with the corresponding replacement bit from the spare cell array 432. If the type field indicates a faulty row, then a row is read from the spare cell array 432. The spare cell control logic 428 uses the column address to select the appropriate replacement cells within the row and directs the selection logic 440 to replace the faulty bits read from the DRAM with the corresponding replacement bits with the value of the selected replacement cell. If the type field indicates a faulty column, then a column is read from the spare cell array 432. The spare cell control logic 428 uses the row address to select the appropriate replacement cell and directs the selection logic 440 to replace the faulty bit read from the DRAM with the corresponding replacement bit with the value of the selected replacement cell.

In the event that the DRAM access is a write operation, a tag match in mapping table 434 indicates a request write to a faulty memory location. For write accesses, the contents of the matching table entry are used to control the writing of spare cells in the spare cell array 432. For a single a single faulty cell, the type field will indicate "single cell" and the index field points to, or contains the address of the replacement cell in the spare cell array 432. The spare cell control logic 428 then causes the addressed spare cell to be written with the value of the corresponding bit from the original write data.

If the type field indicates a faulty row, the spare cell control logic 428 uses the index field and the original DRAM column address to select the replacement cells in the spare cell array 432 which are then written with the original write data. If the type field indicates a faulty column, the sparing cell control logic 428 uses the index field and the original DRAM row address to select the replacement cells in the spare cell array 432 which are then written with the original write data. Thus, for write accesses to faulty DRAM locations the spare cell array 432 contains a copy of the data that would have otherwise been lost when written to a faulty location in the DRAM arrays 420. On subsequent read accesses to the faulty DRAM location, the values stored in the replacement cells are used to replace the faulty bit from the DRAM arrays 420, as described above.

The embodiments as described above provide replacement cells on a global basis, capable of replacing cells from any memory bank. Alternate embodiments may partition the mapping table 434, the spare cell array 432, the spare cell control logic 428 and the fault table 430 into smaller instances. For example, a separate instance of each may be implemented for each bank of memory or for each memory channel. Similarly, the various portions of the invention may be implemented on a global basis, while other portions are implemented on a per-bank or per-channel basis. For example the fault table 430 may be replicated for each bank, while the spare cell array 432 is implemented and managed on a global basis.

The spare cell functionality and logic described above may be implemented with a variety of techniques including hardwired circuits, programmable logic, firmware, configurable logic and combinations thereof. Other embodiments may implement portions of the invention via the above techniques and provide software interfaces to allow the remaining portions to be implemented in software.

Errors in the DRAM arrays 420 may manifest themselves as one-time faults, intermittent faults or permanent hard faults. Hard faults are permanent failures of memory, in which a memory read always results in an ECC error. Hard faults can, for example, be due to a manufacturing defect in the array. Intermittent faults are due to sporadic problems that exist over extended periods of time. For example, an intermittent fault may be caused by elevated temperatures in the arrays. One-time faults are singular, non-recurring events due to, for example, high-energy particle strikes or power supply noise that cause bit-cell flips in DRAM arrays 420. In some embodiments, replacing memory cells in response to detection of temporary errors or faults would result in the spare cells being consumed too quickly without providing a commensurate reliability advantage. Accordingly, in some embodiments the sparing cell control logic 428 implements logic to examine and classify ECC errors and to determine whether the errors are due to one-time faults or not. Additionally in some embodiments, the spare cell control logic 424 may also determine whether the faulty resource in the DRAM array 420 is due to a single faulty cell, an entire row or column. The process of classifying errors is described in greater detail below with reference to FIG. 5.

Figure 5:
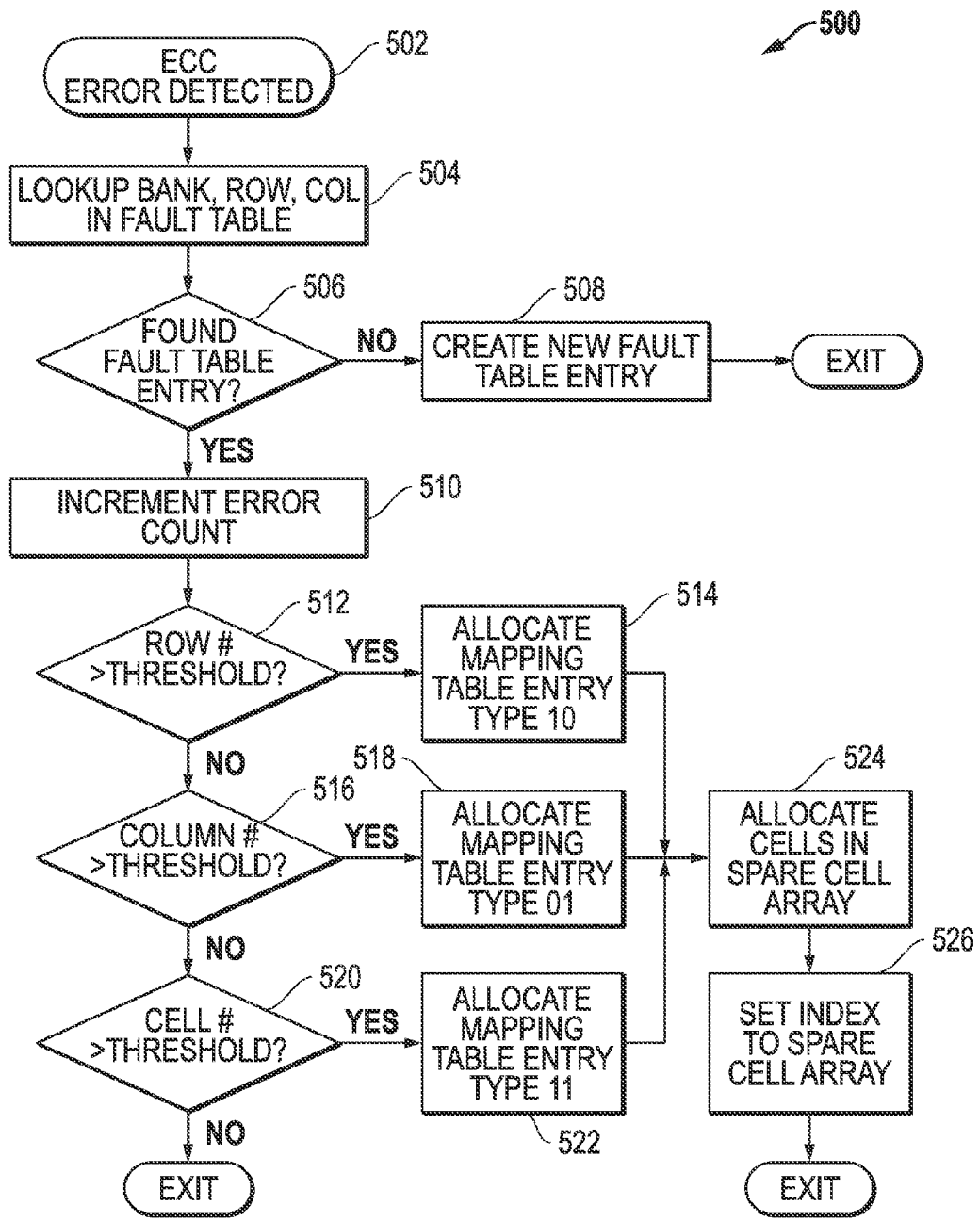
FIG. 5 is a flow diagram illustrating a method for identifying and classifying memory failures in accordance with some embodiments.

FIG. 5 illustrates a flow diagram of a method 500 for identifying and classifying memory failures in accordance with some embodiments. For purposes of description, the method 500 is described with respect to an example implementation at the memory controller 400 of FIG. 4. The method 500 initiates at block 502, responsive to the detection of an ECC error by the memory controller 400. At block 504, the spare cell control logic 428 performs a lookup of the location of the ECC error in the fault table 430, and checks for a tag hit at 506. If a tag match does not occur, a new fault table entry for this location is created at block 508.

A tag match indicates that ECC errors have previously occurred at this location and the error counts for the corresponding bank, row and column are incremented at block 510 to account for this newest event. At blocks 512, 514 and 516 the location of the current error is compared against a threshold value to check if the same row, column or cell is repeatedly involved. If the same bit cell (represented by the bank, row and column address) address is repeatedly at fault then the error is classified as faulty single bit cell. If the same row is repeatedly involved (same bank and row address, but the column address may vary), then the error is classified as a faulty row. Similarly, if the same column is repeatedly involved (same bank and column address, but the row address may vary), then the error is classified as a faulty column. The thresholds may configurable values and may be managed by a number of elements, including an operating system, hypervisor, a basic input/output system (BIOS), firmware or a combination thereof. In other embodiments the thresholds may be fixed values. Once the error is classified as a row, column or cell fault, at blocks 514, 518 and 522 the spare cell control logic 428 creates an entry for the faulty resource in the mapping table 434. It stores the location of the error in the tag field 202 (FIG. 2) and sets the type field 204 to indicate a faulty row, column or cell as appropriate. At block 524 and 526 the spare cell control logic 428 allocates replacement cells in the spare cell array 432 and sets the mapping table index field 208 to point to the replacement cells. If none of the error thresholds is exceeded, the spare cell control logic may deduce that the error was caused by a one-time-fault, or is too infrequent in nature to warrant deployment of spare memory resources.

Figure 6:
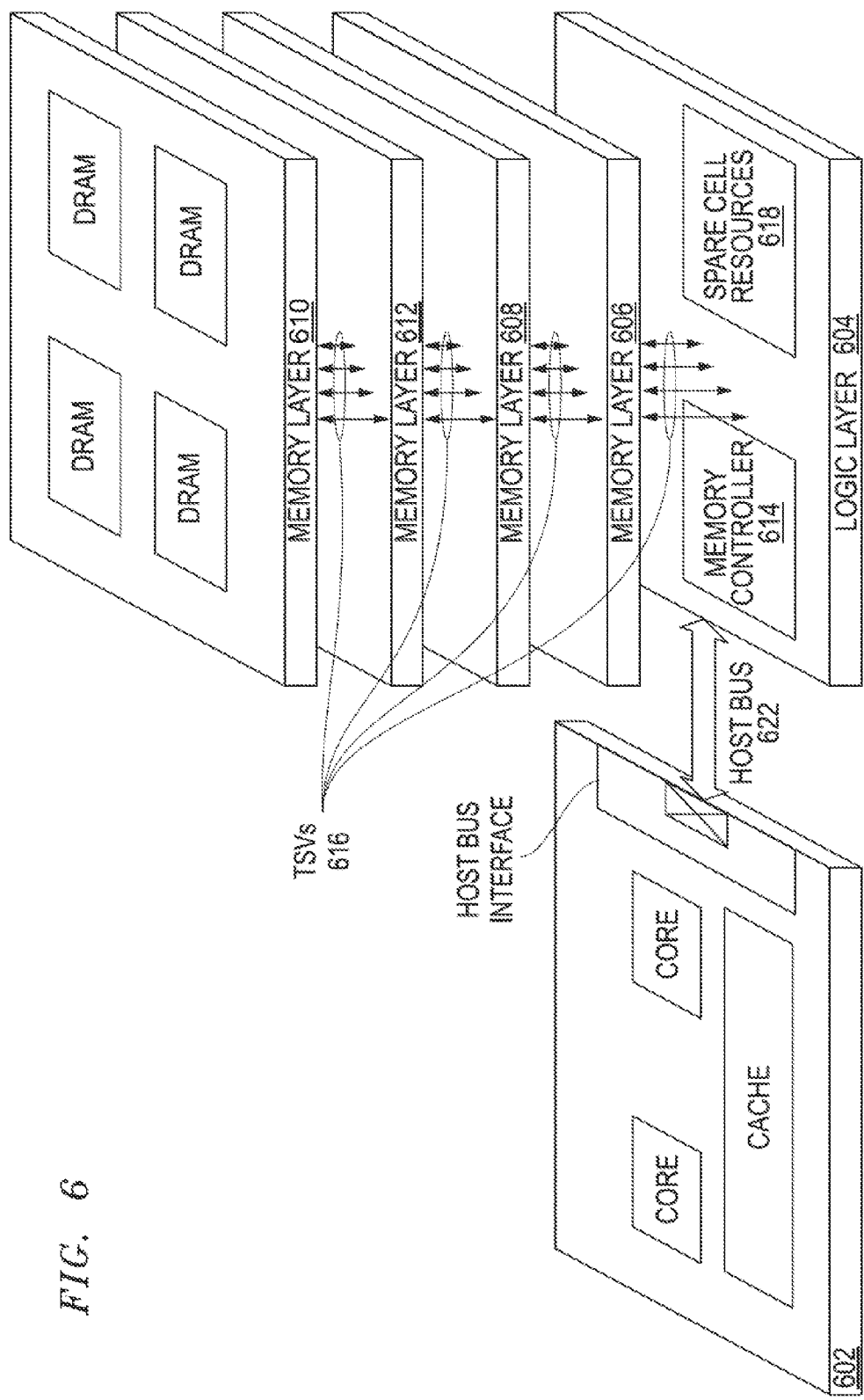
FIG. 6 is a diagram illustrating an exploded perspective view of an example die-stacked processing system which includes a memory subsystem employing spare memory cells external to the protected memory in accordance with some embodiments.

FIG. 6 illustrates an example die-stacked processing system 600 which includes a memory subsystem employing spare memory cells external to the protected memory according to some embodiments. The example system includes a processor die 602 and a vertically-stacked memory subsystem comprised of layers 604-612. Die 602 may include any variety of processor cores and combinations thereof, such as central processing units (CPU) graphics processing units (GPU), digital signal processors (DSP), and the like. The logic die 604 implements the memory controller 614 and sparing resources 618 (comprised of the spare cell control logic, mapping and fault tables and the spare cell array described above with reference to FIG. 1-5). The memory controller 614 implements logic for accessing the memory circuitry of stacked DRAM die 606-612 as well as interfacing to the processor die 602 to service read and write requests. Dies 606-612 implement memory arrays such as DRAM. In the depicted system, the host bus 622 connects the processor die 602 and the memory controller on die 604.

Stacked memory subsystems may employ a separate logic layer to implement the memory controller and related logic functions so that a different semiconductor fabrication process can be used to fabricate the logic layer 604 than that used to fabricate the memory layers 606-612. The circuitry required by the spare resources 618 can thus be more readily accommodated with the additional area provided by the separated logic layer due to die-stacking.

In the illustrated example, dies 606-612 implement memory arrays. The memory arrays may implement any variety of storage devices including, but not limited to, memory architectures such as dynamic random access memory (DRAM), static random access memory (SRAM), read-only memory (ROM), flash memory ferroelectric RAM (F-RAM) magneto-resistive RAM (MRAM) and the like.

The individual dies comprising the vertically stacked memory subsystem 604-612 are interconnected using TSVs 616 or other similar inter-die interconnects. The vertical die stack of processing system 600 may be fabricated using any of a variety of 3D integrated circuit fabrication processes. In one approach, the die 604-612 each are implemented as a separate substrate (e.g., bulk silicon) with active devices and one or more metal routing layers formed at an active surface. This approach can include a wafer-on-wafer process whereby a wafer comprising a matrix of dice is fabricated and thinned, and TSVs are etched through the bulk silicon. Multiple wafers are then stacked to achieve the illustrated layer configuration (e.g., a stack of four wafers comprising memory circuitry die for the three memory layers and a wafer comprising the logic die for a logic layer), aligned, and then joined via thermocompression. The resulting stacked wafer set is singulated to separate the individual 3D IC devices.

In a die-on-die process, the wafer implementing each corresponding layer is first singulated, and then the die are separately stacked and joined to fabricate the 3D IC devices. In a die-on-wafer approach, wafers for one or more layers are singulated to generate the die for one or more layers, and these die are then aligned and bonded to the corresponding die areas of another wafer, which is then singulated to produce the individual 3D IC devices. One benefit of fabricating the die 604-612 on separate wafers is that a different fabrication process can be used to fabricate the logic layers (die 604) than that used to fabricate the memory die (die 606-612). Thus, a fabrication process that provides improved performance and lower power consumption may be used to fabricate dies 604 (and thus provide faster and lower-power interface logic and circuitry for the memory controller 614 and profiler 616), whereas a fabrication process that provides improved cell density and improved leakage control may be used to fabricate the dies 606-612 (and thus provide more dense, lower-leakage bitcells for the stacked memory).

In another approach, the layers 604-612 are fabricated using a monolithic 3D fabrication process whereby a single substrate is used and each die layer is formed on a preceding die layer using a layer transfer process, such as an ion-cut process. The stacked memory devices also may be fabricated using a combination of techniques. For example, a logic layer (die 604) may be fabricated using a monolithic 3D technique, the memory layers (die 606-612) may be fabricated using a die-on-die or wafer-on-wafer technique, or vice versa, and the resulting logic layer stack and memory layer stack then may be bonded together and then to bonded to the interposer substrate.

The depicted processing system 600 may be physically implemented with a variety packaging techniques. In some embodiments, memory subsystem 604-612 may be implemented as a separate vertical stack, horizontally disposed on the surface of an interposer along with processor die 602. In this embodiment, host bus 622 can include conductors implemented in the metal layers of the interposer. In some embodiments, processor die 602 and memory subsystem 604-612 may be contained in separate IC packages. The IC packages are placed on a circuit board or similar substrate and the host bus 622 is implemented in conductors which include pads, pins, traces, vias, solder bumps and the like.

In some embodiments, spare memory cells, such as the spare memory cells of the spare cell array 132 (FIG. 1) may be located in the logic layer 604 in the memory IC package. The memory controller 614 can detect faulty memory cells at the dies 606-612 and replace the faulty memory cells using the spare memory cells in similar fashion as described above with respect to FIGS. 1-5. In some embodiment the spare memory cells are located at an interposer of the processing system 600 on which the layers 604-612 are stacked.

In some embodiments, the apparatus and techniques described above are implemented in a system comprising one or more integrated circuit (IC) devices (also referred to as integrated circuit packages or microchips), such as the IC devices of FIG. 6. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 7:
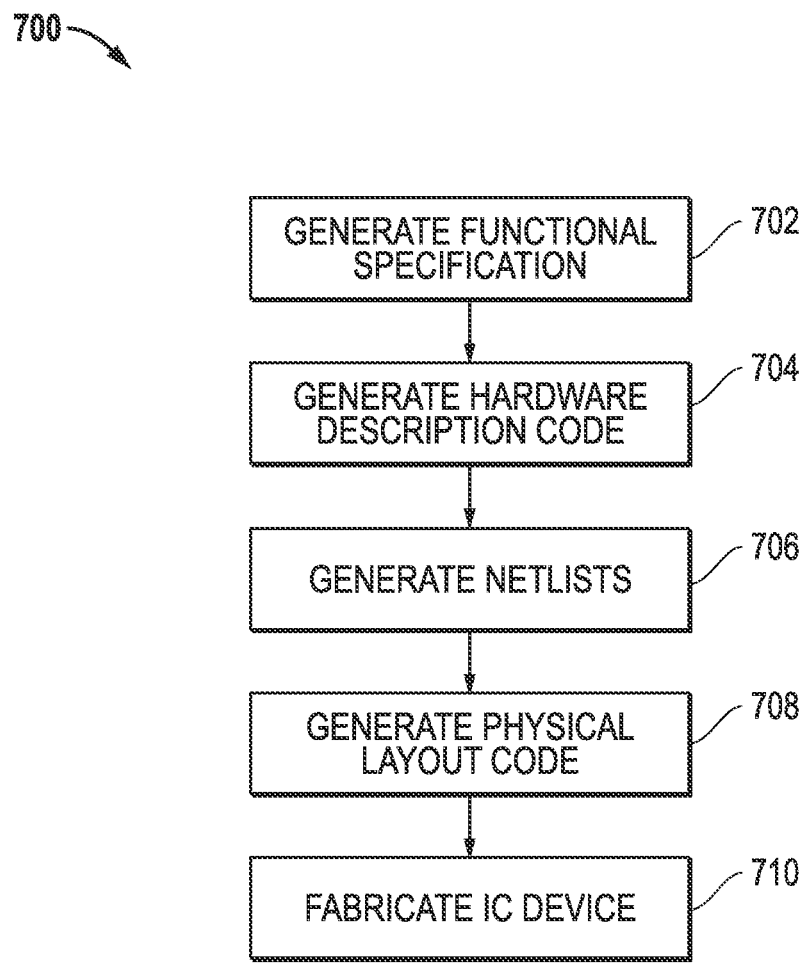
FIG. 7 is a flow diagram illustrating a method for designing and fabricating an integrated circuit (IC) device in accordance with some embodiments.

FIG. 7 is a flow diagram illustrating an example method 700 for the design and fabrication of an IC device implementing one or more aspects of the present invention in accordance with some embodiments. As noted above, the code generated for each of the following processes is stored or otherwise embodied in computer readable storage media for access and use by the corresponding design tool or fabrication tool.

At block 702 a functional specification for the IC device is generated. The functional specification (often referred to as a micro architecture specification (MAS)) may be represented by any of a variety of programming languages or modeling languages, including C, C++, SystemC, Simulink, or MATLAB.

At block 704, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 706 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 708, one or more EDA tools use the netlists produced at block 706 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 710, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

As disclosed herein, in some embodiments a method includes: in response to an error at a first bit cell of a memory, replacing the first bit cell with a second bit cell at a spare cell array; and in response to a first memory access request, satisfying the first memory access request with the second bit cell at the spare cell array and with a third bit cell at the memory. In some aspects the first memory access request comprises a write request, and satisfying the first memory access request comprises: writing first data to the second bit cell at the spare cell array and writing second data to the third bit cell at the memory. In some aspects the first memory access request comprises a read request, and satisfying the first memory access request comprises: reading first data from the second bit cell at the spare cell array and reading second data from the third bit cell at the memory. In some aspects the first bit cell of the memory is identified by a memory address, and replacing the first bit cell with the second bit cell comprises: identifying a first tag value based on the memory address; and storing the first tag value at a mapping table of the integrated circuit device. In some aspects satisfying the first memory access request comprises: identifying a second tag value based on a memory address indicated by the first memory access request; and satisfying the first memory access request with the second bit cell in response to the second tag value matching the first stored tag value. In some aspects replacing the first bit cell with the second bit cell comprises: adjusting an error count for the first bit cell in response to the error at the first bit cell of the memory; and replacing the first bit cell with the second bit cell in response to the error count for the first bit cell exceeding a threshold. In some aspects the method includes in response to a plurality of errors at a first plurality of bit cells of the memory, replacing the first plurality of bit cells of the memory with a second plurality of bit cells of the spare cell array; and in response to a second memory access request targeted to the first plurality of bit cells of the memory, satisfying the second memory access request from the second plurality of bit cells of the spare cell array. In some aspects the first plurality of bit cells comprises a row of the memory. In some aspects the first plurality of bit cells comprises a column of the memory. In some aspects the first plurality of bit cells comprises a third plurality of bit cells of a first row of the memory and a fourth plurality of bit cells from a column of the memory. In some aspects the first memory access request comprises satisfying the first memory request with a plurality of bit cells at the spare cell array including the second bit cell and with the third bit cell at the memory. In some aspects the memory is located at stacked memory die of die-stacked memory device, the die-stacked memory device comprising a set of one or more stacked memory dies comprising memory cell circuitry and comprising a set of one or more logic dies electrically coupled to the set of one or more stacked memory dies; and the spare cell is located in one of the set of one or more logic dies. In some aspects the memory is located at stacked memory die of die-stacked memory device, the die-stacked memory device comprising a set of one or more stacked memory dies comprising memory cell circuitry and comprising a set of one or more logic dies electrically coupled to the set of one or more stacked memory dies, the stacked memory dies stacked on an interposer; and the spare cell is located at the interposer.

In some embodiments, a device includes: a spare cell array to store a plurality of replacement cells for a memory; and a memory controller to: in response to an error at a first bit cell of the memory, replace the first bit cell with a second bit cell at the spare cell array; and in response to a first memory access request, satisfy the first memory access request with the second bit cell and with a third bit cell at the memory. In some aspects the memory controller is to replace the first bit cell with the second bit cell by: adjusting an error count for the first bit cell in response to the error at the first bit cell of the memory; and replacing the first bit cell with the second bit cell in response to the error count for the first bit cell exceeding a threshold. In some aspects the memory controller is to: in response to a plurality of errors at a first plurality of bit cells of the memory, replace the first plurality of bit cells of the memory with a second plurality of bit cells of the spare cell array; and in response to a second memory access request targeted to the first plurality of bit cells of the memory, satisfy the second memory access request from the second plurality of bit cells of the spare cell array. In some aspects the first plurality of bit cells comprises a row of the memory. In some aspects the first plurality of bit cells comprises a column of the memory.

In some embodiments, an integrated circuit (IC) package includes: a die-stacked memory device comprising: a set of one or more stacked memory dies implementing memory cell circuitry; and a set of one or more logic dies electrically coupled to the memory cell circuitry, the set of one or more logic dies coupleable to at least one device external to the die-stacked memory device and comprising a memory controller and a spare cell array store a plurality of replacement cells for the memory cell circuitry, wherein the memory controller is to: in response to an error at a first bit cell of the memory cell circuitry, replace the first bit cell with a second bit cell at the spare cell array; and in response to a first memory access request, satisfy the first memory access request with the second bit cell and with a third bit cell at the memory cell circuitry. In some aspects the memory controller is to replace the first bit cell with the second bit cell by: adjusting an error count for the first bit cell in response to the error at the first bit cell of the memory cell circuitry; and replacing the first bit cell with the second bit cell in response to the error count for the first bit cell exceeding a threshold.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
in response to an error at a first bit cell of a memory, redirecting memory access requests targeting the first bit cell to a second bit cell at a spare cell array, wherein the spare cell array is separate from a first portion of the memory including the first bit cell, the redirecting comprising:
in response to a first memory access request comprising one of a read request to read data from the first portion of the memory including the first bit cell and a third bit cell and a write request to write data to the first bit cell and the third bit cell, satisfying the first memory access request with the second bit cell at the spare cell array and with the third bit cell at the memory, the satisfying comprising:
identifying a first tag value based on a memory address of the memory access request; and
storing the first tag value at a mapping table of an integrated circuit device, the mapping table comprising a plurality of entries, each of the plurality of entries corresponding to a different portion of the spare cell array, each of the plurality of entries including a type field indicating whether a corresponding portion of the spare cell array replaces a row of the memory, a column of the memory, or an individual bit cell of the memory.

2. The method of claim 1, wherein the first memory access request comprises a write request, and wherein satisfying the first memory access request comprises:
writing first data to the second bit cell at the spare cell array and writing second data to the third bit cell at the memory.

3. The method of claim 1, wherein the first memory access request comprises a read request, and wherein satisfying the first memory access request comprises:
reading first data from the second bit cell at the spare cell array and reading second data from the third bit cell at the memory.

4. The method of claim 1, wherein redirecting the memory access requests to the second bit cell comprises:
adjusting an error count for the first bit cell in response to the error at the first bit cell of the memory; and
replacing the first bit cell with the second bit cell in response to the error count for the first bit cell exceeding a threshold.

5. The method of claim 1, further comprising:
in response to a plurality of errors at a first plurality of bit cells of the memory, replacing the first plurality of bit cells of the memory with a second plurality of bit cells of the spare cell array; and
in response to a second memory access request targeted to the first plurality of bit cells of the memory, satisfying the second memory access request from the second plurality of bit cells of the spare cell array.

6. The method of claim 5, wherein the first plurality of bit cells comprises a row of the memory.

7. The method of claim 5, wherein the first plurality of bit cells comprises a column of the memory.

8. The method of claim 5, wherein the first plurality of bit cells comprises a third plurality of bit cells of a first row of the memory and a fourth plurality of bit cells from a column of the memory.

9. The method of claim 1, wherein satisfying the first memory access request comprises satisfying the first memory access request with a plurality of bit cells at the spare cell array including the second bit cell and with the third bit cell at the memory.

10. The method of claim 1, wherein:
the memory is located at stacked memory die of die-stacked memory device, the die-stacked memory device comprising a set of one or more stacked memory dies comprising memory cell circuitry and comprising a set of one or more logic dies electrically coupled to the set of one or more stacked memory dies; and
the spare cell is located in one of the set of one or more logic dies.

11. The method of claim 1, wherein:
the memory is located at stacked memory die of die-stacked memory device, the die-stacked memory device comprising a set of one or more stacked memory dies comprising memory cell circuitry and comprising a set of one or more logic dies electrically coupled to the set of one or more stacked memory dies, the stacked memory dies stacked on an interposer; and
the spare cell is located at the interposer.

12. A device comprising:
a spare cell array to store a plurality of replacement cells for a memory;
a mapping table comprising a plurality of entries, each of the plurality of entries corresponding to a different portion of the spare cell array, each of the plurality of entries including a type field indicating whether a corresponding portion of the spare cell array replaces a row of the memory, a column of the memory, or an individual bit cell of the memory; and
a memory controller to:
in response to an error at a first bit cell of the memory, redirect memory access requests targeting the first bit cell to a second bit cell at the spare cell array, the second bit cell separate from a first portion of the memory including the first bit cell, wherein the redirect comprises:
in response to a first memory access request comprising one of a read request to read data from the first portion of the memory including the first bit cell and a third bit cell and a write request to write data to the first bit cell and the third bit cell, satisfying the first memory access request with the second bit cell and with the third bit cell at the memory based on the mapping table.

13. The device of claim 12, wherein the memory controller is to redirect the memory access requests to the second bit cell by:
adjusting an error count for the first bit cell in response to the error at the first bit cell of the memory; and
redirect the memory access requests to the second bit cell in response to the error count for the first bit cell exceeding a threshold.

14. The device of claim 12, wherein the memory controller is to:
in response to a plurality of errors at a first plurality of bit cells of the memory, replace the first plurality of bit cells of the memory with a second plurality of bit cells of the spare cell array; and
in response to a second memory access request targeted to the first plurality of bit cells of the memory, satisfy the second memory access request from the second plurality of bit cells of the spare cell array.

15. The device of claim 14, wherein the first plurality of bit cells comprises a row of the memory.

16. The device of claim 14, wherein the first plurality of bit cells comprises a column of the memory.

17. An integrated circuit (IC) package comprising:
a die-stacked memory device comprising:
a set of one or more stacked memory dies implementing memory cell circuitry; and
a set of one or more logic dies electrically coupled to the memory cell circuitry, the set of one or more logic dies coupleable to at least one device external to the die-stacked memory device and comprising a memory controller, a mapping table, and a spare cell array to store a plurality of replacement cells for the memory cell circuitry, the spare cell array separate from the memory cell circuitry wherein the memory controller is to:

in response to an error at a first bit cell of the memory cell circuitry, redirect memory access requests from the first bit cell to a second bit cell at the spare cell array, the redirect comprising:

in response to a first memory access request comprising one of a read request to read data from a first portion of the memory cell circuitry including the first bit cell and a third bit cell and a write request to write data to the first bit cell and the third bit cell, satisfying the first memory access request with the second bit cell and with the third bit cell at the memory cell circuitry based on the mapping table; and wherein the mapping table comprises a plurality of entries, each of the plurality of entries corresponding to a different portion of the spare cell array, each of the plurality of entries including a type field indicating whether a corresponding portion of the spare cell array replaces a row of the memory cell circuitry, a column of the memory cell circuitry, or an individual bit cell of the memory cell circuitry.

18. The IC package of claim 17, wherein the memory controller is to redirect the memory access requests to the second bit cell by:

adjusting an error count for the first bit cell in response to the error at the first bit cell of the memory cell circuitry; and redirect the memory access requests to the second bit cell in response to the error count for the first bit cell exceeding a threshold.

* * * * *